US 8,728,624 B2
May 20, 2014

(12) United States Patent
Tamada et al.

(54) FIXING MATERIAL COMPRISING SILANE COMPOUND POLYMER AND PHOTONIC DEVICE SEALED BODY

(71) Applicant: Lintec Corporation, Tokyo (JP)

(72) Inventors: Takashi Tamada, Tokyo (JP); Mikihiro Kashio, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/708,373

(22) Filed: Dec. 7, 2012

(65) Prior Publication Data

US 2013/0096253 A1  Apr. 18, 2013

Related U.S. Application Data

(63) Continuation of application No. 12/934,906, filed as application No. PCT/JP2009/055895 on Mar. 25, 2009, now abandoned.

(30) Foreign Application Priority Data

Mar. 26, 2008 (JP) ................ 2008-079822
Oct. 10, 2008 (JP) ................ 2008-263772

(51) Int. Cl.
*B32B 9/04* (2006.01)
*C08G 77/26* (2006.01)

(52) U.S. Cl.
USPC ............ 428/447; 528/39; 528/41; 528/43; 428/450

(58) Field of Classification Search
None
See application file for complete search history.

(56) References Cited

U.S. PATENT DOCUMENTS

| | | | |
|---|---|---|---|
| 5,232,982 A | 8/1993 | Lucas | |
| 5,605,999 A * | 2/1997 | Chu et al. | 528/24 |
| 5,637,135 A | 6/1997 | Ottenstein et al. | |
| 7,541,134 B2 | 6/2009 | Iwabuchi et al. | |
| 7,736,837 B2 | 6/2010 | Abdallah et al. | |
| 2002/0123592 A1 | 9/2002 | Zhang et al. | |
| 2003/0172845 A1 | 9/2003 | Marx et al. | |
| 2005/0277058 A1 | 12/2005 | Iwabuchi et al. | |
| 2005/0277756 A1 | 12/2005 | Iwabuchi et al. | |
| 2008/0199789 A1 | 8/2008 | Abdallah et al. | |
| 2009/0008673 A1 | 1/2009 | Kato et al. | |

FOREIGN PATENT DOCUMENTS

| | | |
|---|---|---|
| DE | 4219439 A1 | 12/1993 |
| JP | 6-017027 A | 1/1994 |
| JP | 7-507640 A | 8/1995 |
| JP | 2004-025167 A | 1/2004 |
| JP | 2004-359933 A | 12/2004 |
| JP | 2005-179587 A | 7/2005 |
| JP | 2005-263869 A | 9/2005 |
| JP | 2005-350558 A | 12/2005 |
| JP | 2005-352104 A | 12/2005 |
| JP | 2006-328231 A | 12/2006 |
| JP | 2007-112975 A | 5/2007 |
| WO | 2008/102259 A2 | 8/2008 |
| WO | WO 2010/064240 A1 * | 6/2010 |

OTHER PUBLICATIONS

International Search Report of PCT/JP2009/055895, mailing date Jun. 16, 2009.
Sasaki, Tetsuya et al. "A Study on Lead Adsorption Property of Synthesized Mesoporous Silica," Report of the Industrial Research Institute of Ishikawa, 2007, vol. 56, pp. 69-74.

* cited by examiner

*Primary Examiner* — Marc Zimmer
(74) *Attorney, Agent, or Firm* — Westerman, Hattori, Daniels & Adrian, LLP (57) ABSTRACT

A fixing material includes a silane compound polymer as the main component, the silane compound polymer being produced by condensing a silane compound mixture that includes at least one silane compound (1) shown by the following formula (1): $R^1Si(OR^2)_p(X^1)_{3-p}$ (wherein $R^1$ represents a group including an ester structure or a cyanoalkyl group, $R^2$ represents an alkyl group having 1 to 6 carbon atoms or the like, $X^1$ represents a halogen atom, and p is an integer from 0 to 3), and at least one silane compound (2) shown by the following formula (2): $Si(OR^3)_q(X^2)_{4-q}$ (wherein $R^3$ represents an alkyl group having 1 to 6 carbon atoms, $X^2$ represents a halogen atom, and q is an integer from 0 to 4). A sealed optical device includes an optical device that is sealed with a cured product of the fixing material. The fixing material produces a cured product that exhibits high hardness, excellent transparency and heat resistance, and rarely undergoes coloration even when subjected to high-energy light or heat for a long time.

13 Claims, 4 Drawing Sheets

FIXING MATERIAL COMPRISING SILANE COMPOUND POLYMER AND PHOTONIC DEVICE SEALED BODY

CROSS-REFERENCE TO RELATED APPLICATIONS

This application is a continuation of U.S. application Ser. No. 12/934,906, filed Dec. 8, 2010, which is a U.S. National Stage application of International Application No. PCT/P2009/055895 filed Mar. 25, 2009, and which claims priority to Japanese Patent Application No. 2008-079822, filed Mar. 26, 2008, and Japanese Patent Application No. 2008-263772, filed Oct. 10, 2008, the entire contents of which are incorporated herein by reference.

TECHNICAL FIELD

The present invention relates to a fixing material that includes a silane compound polymer as the main component, and produces a cured product that exhibits excellent transparency, excellent heat resistance, and high hardness, and a sealed optical device that includes an optical device that is sealed with a cured product of the fixing material.

BACKGROUND ART

A laser (e.g., semiconductor laser diode (LD)), a light-emitting device (e.g., light-emitting diode (LED)), a light-receiving device, a hybrid optical device, an optical integrated circuit, and the like have been known as optical devices. In recent years, an optical device that emits blue or white light having a short emission peak wavelength has been developed, and widely used. Since the brightness of light-emitting devices with a short emission peak wavelength has remarkably increased, the amount of heat generated by the optical devices tends to increase.

An optical device is normally used as a sealed optical device in which the optical device is sealed with a cured product of an optical device sealing material.

An optical device sealing material that mainly contains a transparent epoxy resin that produces a cured product exhibiting excellent heat resistance and the like has been known.

Along with an increase in brightness of optical devices, the cured product of the optical device sealing material is exposed to high-energy light or a high temperature generated by the optical device for a long time. This may cause a deterioration in the cured product, so that cracks or yellowing (coloration) may occur. The optical device may not be continuously used when cracks have occurred in the cured product of the optical device sealing material. A decrease in transparency may occur when coloration has occurred, so that the brightness of the optical device may decrease.

In order to solve these problems, an optical device sealing material containing a polysilsesquioxane compound as the main component has been proposed (see Patent Documents 1 to 3). Patent Documents 1 to 3 state that a sealed optical device that exhibits excellent crack resistance and heat resistance can be produced using the polysilsesquioxane compound.

However, a cured product of the optical device sealing material containing a polysilsesquioxane compound as the main component disclosed in Patent Documents 1 to 3 may yellow when subjected to high-energy light or high-temperature heat generated by the optical device. Moreover, a cured product of the optical device sealing material containing a polysilsesquioxane compound as the main component may be easily deformed due to insufficient hardness. Therefore, development of an optical device sealing material that produces a cured product that exhibits more excellent heat resistance and high hardness has been desired.

Patent Document 1: JP-A-2004-359933
Patent Document 2: JP-A-2005-263869
Patent Document 3: JP-A-2006-328231

DISCLOSURE OF THE INVENTION

Problems to be Solved by the Invention

The present invention was conceived in view of the above situation. An object of the present invention is to provide a fixing material that produces a cured product that exhibits excellent transparency, excellent heat resistance, and high hardness, and a sealed optical device that includes an optical device that is sealed with a cured product of the fixing material.

Means for Solving the Problems

The inventors conducted extensive studies in order to achieve the above object. As a result, the inventors found that a cured product of a fixing material that mainly includes a silane compound polymer obtained by condensing a mixture of a silane compound that is shown by the following formula (1) and includes a group that includes an ester structure or a cyanoalkyl group and a tetrafunctional silane compound shown by the following formula (2) in the presence of a catalyst, exhibits excellent transparency and heat resistance over a long time, and exhibits high hardness. This finding has led to the completion of the present invention.

According to a first aspect of the present invention, there is provided a fixing material defined below ((1) to (9)).

[1] A fixing material comprising a silane compound polymer as the main component, the silane compound polymer being produced by condensing a silane compound mixture that includes at least one silane compound (1) shown by the following formula (1): $R^1Si(OR^2)_p(X^1)_{3-p}$, wherein $R^1$ represents a group including an ester structure or a cyanoalkyl group, $R^2$ represents an alkyl group having 1 to 6 carbon atoms, an alkoxyalkyl group having 2 to 10 carbon atoms, or a group shown by $Si(R^a)(R^b)(R^c)$, wherein $R^a$, $R^b$, and $R^c$ individually represent a hydrogen atom, an alkyl group having 1 to 6 carbon atoms, an aryl group, or a halogen atom, provided that at least one of $R^a$, $R^b$, and $R^c$ represents a halogen atom when p is 3, and all of $R^2$ represent the group shown by $Si(R^a)(R^b)(R^c)$, $X^1$ represents a halogen atom, and p is an integer from 0 to 3, and at least one silane compound (2) shown by the following formula (2): $Si(OR^3)_q(X^2)_{4-q}$, wherein $R^3$ represents an alkyl group having 1 to 6 carbon atoms, $X^2$ represents a halogen atom, and q is an integer from 0 to 4.

[2] The fixing material according to [1], wherein the molar ratio of the silane compound (1) to the silane compound (2) included in the silane compound mixture is 50:50 to 98:2.

[3] The fixing material according to [1] or [2], wherein the silane compound mixture further includes at least one silane compound (3) shown by the following formula (3): $R^4Si(OR^5)_r(X^3)_{3-r}$, wherein $R^4$ represents a phenyl group that may have a substituent (excluding a group that includes an ester structure), an alkyl group having 1 to 20 carbon atoms that may have a substituent (excluding a group that includes an ester structure and a cyano group), or an alkenyl group having 2 to 20 carbon atoms, $R^5$ represents an alkyl group having 1 to 6 carbon atoms, $X^3$ represents a halogen atom, and r is an integer from 0 to 3.

[4] The fixing material according to [3], wherein the molar ratio of the total amount of the silane compound (1) and the silane compound (2) to the silane compound (3) included in the silane compound mixture is 90:10 to 10:90.

[5] The fixing material according to any one of [1] to [4], wherein the silane compound polymer has a weight average molecular weight of 1000 to 10,000.

[6] The fixing material according to any one of [1] to [5], the fixing material not including a curing agent.

[7] The fixing material according to any one of [1] to [6], the fixing material being used as a sealing material.

[8] The fixing material according to [7], the fixing material being used as an optical device sealing material.

[9] The fixing material according to any one of [1] to [6], the fixing material being used as an adhesive.

According to a second aspect of the present invention, there is provided a sealed optical device defined below ([10]).

[10] A sealed optical device comprising an optical device, and a cured product of the fixing material according to [8], the optical device being sealed with the cured product.

Effects of the Invention

The fixing material according to the present invention produces a cured product that has high hardness and exhibits excellent transparency (i.e., does not show coloration) and excellent heat resistance over a long time even when subjected to high-energy light or high-temperature heat generated by an optical device having a short emission wavelength and high brightness.

Moreover, the bonding target materials can be firmly bonded by utilizing the fixing material according to the present invention as an adhesive.

Since the sealed optical device according to the present invention utilizes the molding material according to the present invention, the sealed optical device exhibits high hardness, excellent transparency, and excellent heat resistance, and rarely undergoes coloration even when used over a long time.

BEST MODE FOR CARRYING OUT THE INVENTION

The present invention is described in detail below in order of 1) a fixing material and 2) a sealed optical device.
1) Fixing Material A fixing material according to the present invention includes a silane compound polymer as the main component, the silane compound polymer being produced by condensing a silane compound mixture in the presence of a catalyst, the silane compound mixture including at least one silane compound (1) shown by the following formula (1): $R^1Si(OR^2)_p(X^1)_{3-p}$, and at least one silane compound (2) shown by the following formula (2): $Si(OR^3)_q(X^2)_{4-q}$.

The expression "includes a silane compound polymer as the main component" means that the fixing material includes one or more silane compound polymers, and may further include additive components described later insofar as the object of the present invention is not impaired. The content of the silane compound polymer in the fixing material according to the present invention is normally 70 wt % or more, preferably 80 wt % or more, and more preferably 90 wt % or more, based on the total amount of the silane compound polymer.

(1) Silane Compound Mixture

The silane compound mixture used in the present invention includes at least one silane compound (1) shown by the formula (1): $R^1Si(OR^2)_p(X^1)_{3-p}$, and at least one silane compound (2) shown by the formula (2): $Si(OR^3)_q(X^2)_{4-q}$. The silane compound mixture may include only at least one silane compound (1) and at least one silane compound (2), or may further include at least one silane compound (3) described later and/or an additional silane compound insofar as the object of the present invention is not impaired.

(i) Silane Compound (1)

The silane compound (1) is shown by the formula (1): $R^1Si(OR^2)_p(X^1)_{3-p}$. A silane compound polymer that exhibits excellent transparency after curing can be obtained using the silane compound (1).

$R^1$ in the formula (1) represents a group including an ester structure or a cyanoalkyl group.

Examples of the group including an ester structure include a group shown by -A-O—C(=O)—R, a group shown by -A-C(=O)—O—R, and the like. The group that includes an ester structure is preferably a group shown by -A-O—C(=O)—R.

Note that A represents a single bond or a linking group, and R represents a hydrocarbon group having 1 to 10 carbon atoms that may have a substituent.

Examples of the linking group represented by A include an alkylene group that may have a substituent, an arylene group that may have a substituent, a combination thereof, and the like.

Examples of the alkylene group include an alkylene group having 1 to 10 carbon atoms, such as a methylene group, an ethylene group, a propylene group, a trimethylene group, a tetramethylene group, a pentamethylene group, and a hexamethylene group; an unsaturated bond-containing alkylene group having 2 to 10 carbon atoms, such as a vinylene group, a propenylene group, a butenylene group, and a pentenylene group; and the like.

Examples of a substituent for the alkylene group include an alkoxy group such as a methoxy group and an ethoxy group; an alkylthio group such as a methylthio group and an ethylthio group; an alkoxycarbonyl group such as a methoxycarbonyl group and an ethoxycarbonyl group; a hydroxyl group; an oxo group (=O); and the like.

The substituent may be bonded to the alkylene group at an arbitrary position. A plurality of identical or different substituents may be bonded to the alkylene group.

Examples of the arylene group include an o-phenylene group, a m-phenylene group, a p-phenylene group, a 2,6-naphthylene group, and the like.

Examples of a substituent for the arylene group include an alkyl group such as a methyl group and an ethyl group; a cyano group; a nitro group; a halogen atom such as a fluorine atom, a chlorine atom, and a bromine atom; an alkoxy group such as a methoxy group and an ethoxy group; an alkylthio group such as a methylthio group and an ethylthio group; and the like.

The substituent may be bonded to the arylene group at an arbitrary position. A plurality of identical or different substituents may be bonded to the arylene group.

A group obtained by combining an alkylene group that may have a substituent and an arylene group that may have a substituent may include an oxygen atom, a group shown by —N($R^d$)— (wherein $R^d$ represents a hydrogen atom or an alkyl group having 1 to 6 carbon atoms. And the alkyl group represented by $R^d$ may bond to another carbon atom of the linking group A to form a ring), or the like. Specific examples of such a group include groups shown by the following formulas. Note that the asterisk indicates the bonding position with the silicon atom.

[Chemical Formula 1]

In order to obtain a cured product of the fixing material that exhibits excellent transparency and heat resistance for a long time, A is preferably an alkylene group having 1 to 6 carbon atoms, more preferably a methylene group, an ethylene group, or a trimethylene group, and particularly preferably a trimethylene group.

Examples of the hydrocarbon group having 1 to 10 carbon atoms represented by R include an alkyl group such as a methyl group, an ethyl group, a n-propyl group, an isopropyl group, a n-butyl group, a t-butyl group, an i-butyl group, a s-butyl group, a n-pentyl group, and a n-octyl group; an alkenyl group such as a vinyl group, an allyl group, and an isopropenyl group; an alkynyl group such as an ethynyl group; an aryl group such as a phenyl group; and the like.

Examples of a substituent for the alkyl group, the alkenyl group, or the alkynyl group include a halogen atom such as a fluorine atom, a chlorine atom, a bromine atom, and an iodine atom; an aryl group such as a phenyl group; and the like.

Examples of a substituent for the aryl group include a halogen atom such as a fluorine atom, a chlorine atom, a bromine atom, and an iodine atom; an aryl group such as a phenyl group; an alkyl group such as a methyl group and an ethyl group; an alkoxy group such as a methoxy group and an ethoxy group; and the like.

Preferable specific examples of $R^1$ are given below.

[Chemical Formula 2]

wherein n is an integer from 1 to 20, $R^e$ represents a hydrogen atom or an alkyl group having 1 to 3 carbon atoms (e.g., methyl group or ethyl group), and n1 is an integer from 1 to 3.

The cyanoalkyl group represented by $R^1$ is not particularly limited insofar as the cyanoalkyl group is an alkyl group that includes a cyano group as a substituent. The substitution position of the cyano group is not particularly limited. The number of carbon atoms of the alkyl group included in the cyanoalkyl group is not particularly limited, but is normally 1 to 20, preferably 1 to 10, and more preferably 1 to 6.

Specific examples of the cyanoalkyl group include a cyanomethyl group, a 1-cyanoethyl group, a 2-cyanoethyl group, a 1-cyanopropyl group, a 2-cyanopropyl group, a 3-cyanopropyl group, a 1-cyanobutyl group, a 2-cyanobutyl group, a 3-cyanobutyl group, a 4-cyanobutyl group, a 5-cyanopentyl group, a 6-cyanohexyl group, and the like.

$R^2$ in the formula (1) represents an alkyl group having 1 to 6 carbon atoms, an alkoxyalkyl group having 2 to 10 carbon atoms, or a group shown by Si($R^a$)($R^b$)($R^c$).

Examples of the alkyl group having 1 to 6 carbon atoms represented by $R^2$ include a methyl group, an ethyl group, a n-propyl group, an isopropyl group, a n-butyl group, a s-butyl group, an isobutyl group, a t-butyl group, a n-pentyl group, a n-hexyl group, and the like.

Examples of the alkoxyalkyl group having 2 to 10 carbon atoms include a methoxymethyl group, a methoxyethyl group, a methoxy-n-propyl group, an ethoxymethyl group, an ethoxyethyl group, an isopropoxymethyl group, an isopropoxyethyl group, a t-butoxymethyl group, a t-butoxyethyl group, and the like.

In the group shown by Si($R^a$)($R^b$)($R^c$), $R^a$, $R^b$, and $R^c$ individually represent a hydrogen atom, an alkyl group having 1 to 6 carbon atoms, such as a methyl group, an ethyl group, a n-propyl group, an isopropyl group, a n-butyl group, a s-butyl group, an isobutyl group, a t-butyl group, a n-pentyl group, or a n-hexyl group, an aryl group such as a phenyl group, or a halogen atom such as a fluorine atom, a chlorine atom, or a bromine atom.

Note that at least one of $R^a$, $R^b$, and $R^c$ represents a halogen atom when p is 3 and all of $R^2$ represent the group shown by $Si(R^a)(R^b)(R^c)$.

Specific examples of the group shown by $Si(R^a)(R^b)(R^c)$ include a silyl group; a trialkylsilyl group (e.g., trimethylsilyl group, triethylsilyl group, triisopropylsilyl group, tri-n-butylsilyl group, dimethylethylsilyl group, and dimethyl-t-butylsilyl group); a phenylsilyl group (e.g., triphenylsilyl group and diphenylmethylsilyl group); a halogenosilyl group (e.g., trichlorosilyl group and tribromosilyl group); and the like.

$X^1$ represents a halogen atom such as a fluorine atom, a chlorine atom, a bromine atom, or an iodine atom.

p is an integer from 0 to 3.

When p is two or more, two or more $OR^2$ may be the same or different. When (3-p) is two or more, two or more $X^1$ may be the same or different.

Specific examples of the silane compound (1) include trialkoxysilane compounds in which $R^1$ is a group including an ester structure, such as 3-acetoxypropyltrimethoxysilane, 3-acetoxypropyltriethoxysilane, 3-acetoxypropyltripropoxysilane, 3-acetoxypropyltributoxysilane, 3-trifluoromethylcarbonyloxypropyltrimethoxysilane, 3-trifluoromethylcarbonyloxypropyltriethoxysilane, 3-trifluoromethylcarbonyloxypropyltripropoxysilane, 3-trifluoromethylcarbonyloxypropyltributoxysilane, 2-acetoxyethyltrimethoxysilane, 2-acetoxyethyltriethoxysilane, acetoxymethyltripropoxysilane, acetoxymethyltributoxysilane, 11-acetoxyundecyltrimethoxysilane, 3-acryloxypropyltriethoxysilane, 3-acryloxypropyltripropoxysilane, 3-methacryloxypropyltributoxysilane, 3-methacryloxypropyltriethoxysilane, 3-methacryloxypropyltrimethoxysilane, 3-methacryloxypropyltriisopropoxysilane, 2-methacryloxyethyltrimethoxysilane, 2-methacryloxyethyltriethoxysilane, methacryloxymethyltrimethoxysilane, methacryloxymethyltriethoxysilane, methacryloxymethyltripropoxysilane, 3-benzoyloxypropyltrimethoxysilane, 3-benzoyloxypropyltrimethoxysilane, 2-methoxycarbonylethyltriethoxysilane, 2-methoxycarbonylethyltripropoxysilane, N-(3-acryloxy-2-hydroxypropyl)-3-aminopropyltriethoxysilane, O-(methacryloxyethyl)-N-(triethoxy silylpropyl)urethane, N-(3-methacryloxy-2-hydroxypropyl)-3-aminopropyltriethoxysilane, and N-[3-(triethoxysilyl)propyl]-2-carbomethoxyaziridine;

tris(alkoxyalkoxy)silanes in which $R^1$ is a group including an ester structure, such as 3-acetoxypropyltris(methoxyethoxy)silane, 3-acetoxypropyltris(ethoxymethoxy)silane, 3-acryloxypropyltris(methoxyethoxy)silane, 3-acryloxypropyltris(ethoxymethoxy), 3-methacryloxypropyltris(methoxyethoxy)silane, and 3-methacryloxypropyltris(ethoxymethoxy)silane;

trissiloxysilanes in which $R^1$ is a group including an ester structure, such as 3-acetoxypropyltris(trichlorosiloxy)silane, 3-acetoxypropyltris(tribromosiloxy)silane, 3-acetoxypropyltris(trifluorosiloxy)silane, 3-acryloxypropyltris(trichlorosiloxy)silane, 3-acryloxypropyltris(tribromosiloxy)silane, 3-acryloxypropyltris(trifluorosiloxy)silane, 3-methacryloxypropyltris(trichlorosiloxy)silane, 3-methacryloxypropyltris(tribromosiloxy)silane, and 3-methacryloxypropyltris(trifluorosiloxy)silane;

halogenosilane compounds in which $R^1$ is a group including an ester structure, such as 3-acetoxypropyltrichlorosilane, 3-acetoxypropylbromodimethoxysilane, 3-acetoxypropyldichloromethoxysilane, 3-acetoxypropyltrichlorosilane, 3-trifluoromethylcarbonyloxypropyldichloroethoxysilane, 3-trifluoromethylcarbonyloxypropylbromodimethoxysilane, 3-trifluoromethylcarbonyloxypropyltrichlorosilane, 3-trifluoromethylcarbonyloxypropyltribromosilane, 2-acetoxyethyldichloromethoxysilane, 2-acetoxyethyltrichlorosilane, acetoxymethyltrichlorosilane, acetoxymethylbromodimethoxysilane, 11-acetoxyundecyltrichlorosilane, 11-acetoxyundecyldichloroethoxysilane, 3-acryloxypropyldichloromethoxysilane, 3-acryloxypropyltrichlorosilane, 3-methacryloxypropylbromodimethoxysilane, 3-methacryloxypropyldichloroethoxysilane, 3-methacryloxypropyldichloromethoxysilane, 3-methacryloxypropyltrichlorosilane, 2-methacryloxyethylbromodimethoxysilane, 2-methacryloxyethyldichloroethoxysilane, methacryloxymethyldichloromethoxysilane, methacryloxymethyltrichlorosilane, methacryloxymethylbromodimethoxysilane, 3-benzoyloxypropyldichloroethoxysilane, 3-benzoyloxypropyldichloromethoxysilane, 2-methoxycarbonylethyltrichlorosilane, 2-methoxycarbonylethylbromodimethoxysilane, N-(3-acryloxy-2-hydroxypropyl)-3-aminopropyldichloroethoxysilane, O-(methacryloxyethyl)-N-(dichloromethoxysilylpropyl)urethane, N-(3-methacryloxy-2-hydroxypropyl)-3-aminopropyltrichlorosilane, and N-[3-(trichlorosilyl)propyl]-2-carbomethoxyaziridine;

trialkoxysilane compounds in which $R^1$ is a cyanoalkyl group, such as cyanomethyltrimethoxysilane, cyanomethyltriethoxysilane, 2-cyanoethyltrimethoxysilane, 2-cyanoethyltriethoxysilane, 2-cyanoethyltripropoxysilane, 2-cyanopropyltrimethoxysilane, 2-cyanopropyltriethoxysilane, 3-cyanopropyltrimethoxysilane, 3-cyanopropyltriethoxysilane, 3-cyanopropyltripropoxysilane, 3-cyanopropyltributoxysilane, 4-cyanobutyltrimethoxysilane, 5-cyanopentyltrimethoxysilane, and 6-cyanohexyltrimethoxysilane;

halogenosilane compounds in which $R^1$ is a cyanoalkyl group, such as cyanomethyltrichlorosilane, cyanomethylbromodimethoxysilane, 2-cyanoethyldichloromethoxysilane, 2-cyanoethyldichloroethoxysilane, 3-cyanopropyltrichlorosilane, 3-cyanopropyltribromosilane, 3-cyanopropyldichloromethoxysilane, 3-cyanopropyldichloroethoxysilane, 3-cyanopropylchlorodimethoxysilane, 3-cyanopropylchlorodiethoxysilane, 4-cyanobutylchlorodiethoxysilane, and 3-cyanobutylchlorodiethoxysilane; and the like.

These silane compounds (1) may be used either individually or in combination.

In order to obtain a fixing material that exhibits more excellent transparency and heat resistance, the silane compound (1) is preferably a trialkoxysilane compound, more preferably a trialkoxysilane compound in which $R^1$ is an acetoxyalkyl group, an acryloxyalkyl group, a methacryloxyalkyl group, a benzoylalkyl group, or a cyanoalkyl group, still more preferably a trialkoxysilane compound in which $R^1$ is an acetoxyalkyl group or a cyanoalkyl group, and particularly preferably a trialkoxysilane compound in which $R^1$ is an acetoxymethyl group, a 2-acetoxyethyl group, a 3-acetoxypropyl group, a 2-cyanoethyl group, or a 3-cyanopropyl group.

(ii) Silane Compound (2)

The silane compound (2) is shown by the formula (2): $Si(OR^3)_q(X^2)_{4-q}$. A cured product that exhibits high hardness can be obtained using the silane compound (2).

$R^3$ in the formula (2) represents an alkyl group having 1 to 6 carbon atoms, such as a methyl group, an ethyl group, a n-propyl group, an isopropyl group, a n-butyl group, a s-butyl group, an isobutyl group, a t-butyl group, a n-pentyl, or a n-hexyl group.

$X^2$ represents a halogen atom similar to that of $X^1$.

q is an integer from 0 to 4.

When q is two or more, two or more $OR^3$ may be the same or different. When (4-q) is two or more, two or more $X^2$ may be the same or different.

Specific examples of the silane compound (2) include silane compounds in which q in the formula (2) is 4, such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane, and triethoxymethoxysilane; silane compounds in which q in the formula (2) is 3, such as trimethoxychlorosilane, trimethoxybromosilane, trimethoxyfluorosilane, triethoxychlorosilane, triethoxybromosilane, triisopropylchlorosilane, and tri-n-propylbromosilane;

silane compounds in which q in the formula (2) is 2, such as dimethoxydichlorosilane, diethoxydichlorosilane, di-n-propoxydichlorosilane, diisopropoxydichlorosilane, di-t-butoxydichlorosilane, dimethoxydibromosilane, diethoxydibromosilane, di-n-propoxydibromosilane, diisopropoxydibromosilane, and di-t-butoxydibromosilane; silane compounds in which q in the formula (2) is 1, such as methoxytrichlorosilane, ethoxytrichlorosilane, n-propoxytrichlorosilane, isopropoxytrichlorosilane, t-butoxytrichlorosilane, methoxytribromosilane, ethoxytribromosilane, n-propoxytribromosilane, isopropoxytribromosilane, and t-butoxytribromosilane; silane compounds in which q in the formula (2) is 1, such as tetrafluorosilane, tetrachlorosilane, tetrabromosilane, tetraiodosilane, trichlorobromosilane, dichlorodibromosilane, and chlorotribromosilane; and the like.

These silane compounds (2) may be used either individually or in combination.

The silane compound (1) and the silane compound (2) are preferably used so that the molar ratio of the silane compound (1) to the silane compound (2) is 50:50 to 98:2, and more preferably 70:30 to 95:5.

(iii) Silane Compound (3)

The silane compound mixture used in the present invention preferably includes a silane compound (3) shown by the following formula (3): $R^4Si(OR^5)_r(X^3)_3$, in addition to the silane compound (1) and the silane compound (2). A cured product that shows only a small degree of coloration even when used for a long time can be obtained using the silane compound (3).

$R^4$ in the formula (3) represents a phenyl group that may have a substituent (excluding a group that includes an ester structure), an alkyl group having 1 to 20 carbon atoms that may have a substituent (excluding a group that includes an ester structure and a cyano group), or an alkenyl group having 2 to 20 carbon atoms.

The substituent for the phenyl group represented by $R^4$ is not particularly limited insofar as the substituent is a group other than a group including an ester structure. Examples of a substituent for the phenyl group represented by $R^4$ include an alkyl group such as a methyl group, an ethyl group, a n-propyl group, an isopropyl group, a n-butyl group, a s-butyl group, an isobutyl group, a t-butyl group, a n-pentyl group, a n-hexyl group, a n-heptyl group, a n-octyl group, and an iso-octyl group; an alkoxy group such as a methoxy group and an ethoxy group; a halogen atom such as a fluorine atom and a chlorine atom; and the like.

Specific examples of the phenyl group that may have a substituent include a phenyl group, a 2-chlorophenyl group, a 4-methylphenyl group, a 3-ethylphenyl group, a 2-methoxyphenyl group, and the like.

Examples of the alkyl group having 1 to 20 carbon atoms that may have a substituent include a methyl group, an ethyl group, a n-propyl group, an isopropyl group, a n-butyl group, a s-butyl group, an isobutyl group, a t-butyl group, a n-pentyl group, a n-hexyl group, a n-heptyl group, a n-octyl group, an isooctyl group, a n-nonyl group, a n-decyl group, a n-dodecyl group, and the like.

The substituent for the alkyl group having 1 to 20 carbon atoms is not particularly limited insofar as the substituent is a group other than a group including an ester structure and a cyano group. Examples of the substituent for the alkyl group having 1 to 20 carbon atoms include a glycidyl group, a glycidoxy group, an epoxy group, a 3,4-epoxycyclohexyl group, a mercapto group, a carboxyl group, and an acetylacetonyl group; an alkoxy group such as a methoxy group and an ethoxy group; a substituted or unsubstituted amino group such as an amino group, an aminoethylamino group, and a phenylamino group; and the like.

Examples of the alkenyl group having 2 to 20 carbon atoms include a vinyl group, an allyl group, an isopropenyl group, and the like.

$R^5$ represents an alkyl group having 1 to 6 carbon atoms similar to that of $R^2$, $X^3$ represents a halogen atom similar to that of $X^1$, and r is an integer from 0 to 3.

Specific examples of the silane compound (3) include substituted or unsubstituted phenylsilane compounds such as phenyltrimethoxysilane, 4-methoxyphenyltrimethoxysilane, 2-chlorophenyltrimethoxysilane, phenyltriethoxysilane, 2-methoxyphenyltriethoxysilane, phenyldimethoxyethoxysilane, phenyldiethoxymethoxysilane, phenyltrichlorosilane, phenylchlorodimethoxysilane, phenyldichloromethoxysilane, phenyltribromosilane, phenylchloromethoxyethoxysilane, 4-methoxyphenyltrichlorosilane, 2-chlorophenyltrichlorosilane, and 2-ethoxyphenyltrichlorosilane;

alkylsilane compounds such as methyltrimethoxysilane, methyltriethoxysilane, ethyltrimethoxysilane, ethyltriethoxysilane, n-propyltrimethoxysilane, n-butyltriethoxysilane, i-butyltrimethoxysilane, n-pentyltriethoxysilane, n-hexyltrimethoxysilane, i-octyltriethoxysilane, dodecyltrimethoxysilane, methyldimethoxyethoxysilane, methyldiethoxymethoxysilane, methyltrichlorosilane, methylchlorodimethoxysilane, methyldichloromethoxysilane, methyldichloroethoxysilane, methyltribromosilane, methylchlorodiethoxysilane, ethyltrichlorosilane, ethylchlorodimethoxysilane, ethyldichloromethoxysilane, ethyltribromosilane, n-propyltrichlorosilane, n-propylchlorodimethoxysilane, and n-propyldichloromethoxysilane;

substituted alkylsilane compounds such as glycidyltrimethoxysilane, glycidyltriethoxysilane, glycidyltripropoxysilane, glycidyltributoxysilane, glycidyltrichlorosilane, glycidylchlorodimethoxysilane, glycidyldichloromethoxysilane, glycidylchlorodiethoxysilane, glycidyldichloroethoxysilane, glycidyltribromosilane, 3-glycidoxypropyltrimethoxysilane, 3-glycidoxypropyltriethoxysilane, 3-glycidoxypropyltripropoxysilane, 3-glycidoxypropyltributoxysilane, 3-glycidoxypropyltrichlorosilane, 3-glycidoxypropylchlorodimethoxysilane, 3-glycidoxypropyldichloromethoxysilane, 3-glycidoxypropylchlorodiethoxysilane, 3-glycidoxypropyldichloroethoxysilane, 3-glycidoxypropyltribromosilane, 2-(3,4-epoxycyclohexyl)ethyltrimethoxysilane, 2-(3,4-epoxycyclohexyl)ethyltriethoxysilane, 2-(3,4-epoxycyclohexyl)ethyltripropoxysilane, 2-(3,4-epoxycyclohexyl)ethyltributoxysilane, 3-[(2-aminoethyl)amino]propyltrimethoxysilane, 3-aminopropyltrimethoxysilane, 3-phenylaminopropyltrimethoxysilane, 3-mere aptopropyltrimethoxysilane, 3-mercaptopropyltriethoxysilane, 3-mercaptopropyltripropoxysilane, 3-mercaptopropyltributoxysilane, 3-mercaptopropyltrichlorosilane, 3-mercaptopropylchlorodimethoxysilane, 3-mercaptopropyldichloromethoxysilane, 3-mercaptopropylchlorodiethoxysilane, 3-mercaptopropyldichloroethoxysilane, and 3-mercaptopropyltribromosilane; alkenylsilane compounds such as vinyltrimethoxysilane, vinyltriethoxysilane, vinyltripropoxysilane, vinyltributoxysilane, and allyltrimethoxysilane; and the like.

These silane compounds (3) may be used either individually or in combination.

The silane compound (3) is preferably used so that the molar ratio of the total amount of the silane compound (1) and the silane compound (2) to the silane compound (3) is 90:10 to 10:90, and more preferably 80:20 to 20:80.

(2) Silane Compound Polymer

The fixing material according to the present invention includes a silane compound polymer produced by condensing the silane compound mixture (hereinafter may be referred to as "silane compound") as the main component.

The silane compound may be condensed by an arbitrary method. For example, a silane compound solution that optionally contains a catalyst may be stirred to obtain a silane compound polymer.

An acid catalyst or a base catalyst may be used as the catalyst.

Examples of the acid catalyst include an inorganic acid such as hydrochloric acid, sulfuric acid, nitric acid, and phosphoric acid, and an organic acid such as methanesulfonic acid, trifluoromethanesulfonic acid, benzenesulfonic acid, p-toluenesulfonic acid, acetic acid, and trifluoroacetic acid.

Examples of the base catalyst include organic bases such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; organic base hydroxides such as tetramethylammonium hydroxide and tetraethylammonium hydroxide; metal alcoholates such as sodium methoxide, sodium ethoxide, sodium t-butoxide, and potassium t-butoxide; metal hydrides such as sodium hydride and calcium hydride; metal hydroxides such as sodium hydroxide, potassium hydroxide, and calcium hydroxide; metal carbonates such as sodium carbonate, potassium carbonate, and magnesium carbonate; metal hydrogencarbonates such as sodium hydrogencarbonate, and potassium hydrogencarbonate; and the like.

The catalyst is normally used in an amount of 0.1 to 10 mol %, and preferably 1 to 5 mol %, based on the total number of moles of the silane compounds.

Examples of the solvent include water; aromatic hydrocarbons such as benzene, toluene, and xylene; esters such as methyl acetate, ethyl acetate, propyl acetate, and methyl propionate; ketones such as acetone, methyl ethyl ketone, methyl isobutyl ketone, and cyclohexanone; alcohols such as methyl alcohol, ethyl alcohol, n-propyl alcohol, isopropyl alcohol, n-butyl alcohol, isobutyl alcohol, s-butyl alcohol, and t-butyl alcohol; and the like. These solvents may be used either individually or in combination.

Among these, water, aromatic hydrocarbons, and a mixture thereof are preferable, with a mixture of water and toluene being particularly preferable. When using a mixture of water and toluene, the ratio (volume ratio) of water to toluene is preferably 1:9 to 9:1 and more preferably 2:8 to 6:4.

The solvent is normally used so that the total number of moles of the silane compounds is 0.1 to 10, and preferably 0.5 to 8, per liter of the solvent.

The silane compounds are normally condensed in a temperature range from 0° C. to the boiling point of the solvent (preferably 20 to 100° C.). If the reaction temperature is too low, the condensation reaction may proceed insufficiently. If the reaction temperature is too high, gelation may occur. The reaction time is normally 30 minutes to 20 hours.

The reaction is terminated by adding an aqueous solution of an alkali such as sodium hydrogencarbonate when using the acid catalyst, or terminated by adding an acid such as hydrochloride when using the base catalyst. Salts produced are removed by filtration, washing with water, or the like to obtain the target silane compound polymer.

The weight average molecular weight (Mw) of the silane compound polymer is normally 1000 to 10,000, and preferably 1500 to 6000. The weight average molecular weight (Mw) may be determined as a standard polystyrene-reduced value by gel permeation chromatography (GPC) using tetrahydrofuran (THF) as a solvent, for example.

(3) Fixing Material

The fixing material according to the present invention may include only the silane compound polymer obtained as described above, or may be a composition that includes the silane compound polymer and additional components insofar as the object of the present invention is not impaired.

Examples of the additional components include an antioxidant, a UV absorber, a light stabilizer, a diluent, a silane coupling agent, a curing agent, and the like.

An antioxidant is added to prevent deterioration due to oxidation during heating.

Examples of the antioxidant include a phenol-based antioxidant, a sulfur-containing antioxidant, a phosphorus-containing antioxidant, and the like.

Specific examples of the phenol-based antioxidant include monophenols such as 2,6-di-t-butyl-p-cresol, dibutylhydroxytoluene, butylated hydroxyanisole, 2,6-di-t-butyl-p-ethylphenol, and stearyl-β-(3,5-di-t-butyl-4-hydroxyphenyl)propionate; bisphenols such as 2,2'-methylenebis(4-methyl-6-t-butyl phenol), 2,2'-methylenebis(4-ethyl-6-t-butylphenol), 4,4'-thiobis(3-methyl-6-t-butylphenol), 4,4'-butylidenebis(3-methyl-6-t-butylphenol), and 3,9-bis[1,1-dimethyl-2-{β-(3-t-butyl-4-hydroxy-5-methylphenyl)propionyloxy}ethyl]-2,4,8,10-tetraoxaspiro[5,5]undecane; polymer-type phenols such as 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis[methylene-3-(3',5'-di-t-butyl-4'-hydroxyphenyl)propionate]methane, bis[3,3'-bis-(4'-hydroxy-3'-t-butylphenyl)butylic acid]glycol ester, 1,3,5-tris(3',5'-di-t-butyl-4'-hydroxybenzyl)-S-triazine-2,4,6-(1H,3H,5H)trion, and tocophenol; and the like.

Examples of the sulfur-containing antioxidant include dilauryl-3,3'-thiodipropionate, dimyristyl-3,3'-thiodipropionate, and distearyl-3,3'-thiodipropionate, and the like.

Examples of the phosphorus-containing antioxidant include phosphite compounds such as triphenylphosphite, diphenylisodecylphosphite, phenyldiisodecylphosphite, tris(nonylphenyl)phosphite, diisodecylpentaerythritolphosphite, tris(2,4-di-t-butylphenyl)phosphite, cyclic neopentan-tetra-ylbis(octadecyl)phosphite, cyclic neopentan-tetra-ylbis(2,4-di-t-butylphenyl)phosphate, cyclic neopentan-tetra-ylbis(2,4-di-t-butyl-4-methylphenyl)phosphate, and bis[2-t-butyl-6-methyl-4-{2-(octadecyloxycarbonyl)ethyl}phenyl]hydrogen phospate; and oxaphosphaphenanthrene oxides such as 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, and 10-desiloxy-9,10-dihydro-9-oxa-10-phosphaphenanthrene-10-oxide.

These antioxidants may be used either individually or in combination.

The antioxidant is normally used in an amount of 0.01 to 10 parts by weight relative to 100 parts by weight of the silane compound polymer.

A UV absorber is added to increase the light resistance of the fixing material.

Examples of the UV absorber include salicylic acids such as phenyl salicylate, p-t-butylphenyl salicylate, and p-octylphenyl salicylate; benzophenones such as 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, and 2-hydroxy-4-methoxy-5-sulfobenzophenone; benzotriazoles such as 2-(2'-hydroxy-5'-methylphenyl)benzotriazole, 2-(2'-hydroxy-5'-t-butylphenyl)benzotriazole, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3', 5'-di-t-amylphenyl)benzotriazole, and 2-{(2'-hydroxy-3',3", 4",5",6"-tetrahydrophthalimidemethyl)-5'-methylphenyl}benzotriazole; hindered amines such as bis(2, 2,6,6-tetramethyl-4-piperidyl)sebacate, bis(1,2,2,6,6-pentamethyl-4-piperidyl)sebacate, and bis(1,2,2,6,6-pentamethyl-4-piperidyl)[{3,5-bis(1,1-dimethylethyl)-4-hydroxyphenyl}methyl]butylmalonate; and the like.

These UV absorbers may be used either individually or in combination.

The UV absorber is normally used in an amount of 0.01 to 10 parts by weight relative to 100 parts by weight of the silane compound polymer.

A light stabilizer is added to increase the light resistance of the fixing material.

Examples of the light stabilizer include hindered amines such as poly[{6-(1,1,3,3-tetramethylbutyl)amino-1,3,5-triazine-2,4-diyl}{(2,2,6,6-tetramethyl-4-piperidine)imino}hexamethylene{(2,2,6,6-tetramethyl-4-piperidine)imino}], and the like.

These light stabilizers may be used either individually or in combination.

The light stabilizer is normally used in an amount of 0.01 to 10 parts by weight relative to 100 parts by weight of the silane compound polymer.

A diluent is added to adjust the viscosity of the fixing material. Examples of the diluent include glycerol diglycidyl ether, butanediol diglycidyl ether, diglycidyl aniline, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene mono-oxide, vinylcyclohexene dioxide, methylated vinylcyclohexene dioxide, and the like. These diluents may be used either individually or in combination.

A silane coupling agent is added to ensure that the fixing material exhibits high adhesion to another material. Examples of the silane coupling agent include 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, and the like.

Examples of the curing agent include an acid anhydride, an aromatic amine, a phenol resin, a photoinitiator, and the like.

The fixing material according to the present invention may include a curing agent, but can be easily cured without using a curing agent. A curing agent may cause deterioration. Therefore, it is preferable that the fixing material does not include a curing agent from the viewpoint of maintaining excellent transparency and excellent heat resistance for a long time.

The fixing material according to the present invention may be produced by optionally mixing the silane compound polymer with one or more of the additional components, for example.

The fixing material according to the present invention may be used as an electric insulating fixing material such as a semiconductor sealing material (e.g., IC sealing material), an optical device sealing material (e.g. LED sealing material), or a material for printed circuit boards; an adhesive; a building material such as a lamp cover or a window material; or the like.

The fixing material according to the present invention may be suitably used as a sealing material. In particular, the fixing material according to the present invention is preferably used as an optical device sealing material (described later) due to excellent heat resistance, transparency, and hardness.

When using the fixing material according to the present invention as an adhesive, examples of the bonding target material include glass such as soda lime glass and heat resistant hard glass; ceramics; a metal such as iron, copper, aluminum, gold, silver, platinum, chromium, titanium, an alloy thereof, and stainless steel (SUS302, SUS304, SUS304L, SUS309); synthetic resins such as polyethyleneterephthalate, polybuthyleneterephthalate, polyethylenenaphthalate, polyethylene, polypropylene, polyvinyl chloride, polyvinylidene chloride, polyvinyl alcohol, an ethylene-vinyl acetate copolymer, polystyrene, polycarbonate, polymethylpentene, polysulfone, polyether ether ketone, polyether sulfone, polyphenylene sulfide, polyetherimide, polyimide, a fluororesin, polyamide, an acrylic resin, a norbornene resin, a cycloolefin resin, and a glass epoxy resin; and the like.

The bonding target materials (e.g., glass and glass, ceramic and ceramic, metal and metal, synthetic resin and synthetic resin, glass and ceramic, glass and metal, glass and synthetic resin, ceramic and metal, ceramic and synthetic resin, or metal and synthetic resin) can be firmly bonded by utilizing the fixing material according to the present invention as an adhesive.

Specifically, the bonding target materials can be firmly bonded by applying the fixing material according to the present invention to one or both of the bonding target materials, followed by drying and curing the fixing material.

When forming a metal conductor circuit on a flat surface of an insulating substrate using the fixing material according to the present invention as an adhesive, the conductor circuit thus formed exhibits sufficient adhesion (adhesive strength) to the substrate.

The fixing material according to the present invention may be suitably used as an optical adhesive due to excellent transparency.

The fixing material according to the present invention may be cured by a method similar to a method that cures a molded product that includes an optical device in the production of an optical device sealing material according to the present invention described later.

The cured product of the fixing material according to the present invention has high hardness, and exhibits excellent heat resistance over a long time.

The hardness (Shore D) of the cured product of the fixing material according to the present invention may be measured using a durometer in accordance with JIS K 7215, for example. The hardness (Shore D) of the cured product of the fixing material according to the present invention is preferably 20 or more.

The cured product of the fixing material according to the present invention exhibits excellent heat resistance over a long time when the cured product is subjected to a high temperature for a long time (e.g., at 150° C. for 500 hours), and shows only a small decrease in transparency, for example.

The cured product of the fixing material according to the present invention also exhibits excellent transparency. The light transmittance (wavelength: 400 nm) of the cured product of the fixing material according to the present invention is preferably 85% or more.

2) Sealed Optical Device

A sealed optical device according to the present invention includes an optical device, and a cured product of the fixing material (optical device sealing material) according to the present invention, the optical device being sealed with the cured product.

Examples of the optical device include a light-emitting device (e.g., LED and LD), a light-receiving device, a hybrid optical device, an optical integrated circuit, and the like.

The sealed optical device according to the present invention may be produced by molding the optical device sealing material according to the present invention into a desired shape to obtain a molded product that includes an optical device, and curing the molded product, for example.

Various methods may be used to mold the optical device sealing material according to the present invention into a desired shape. For example, a transfer molding method, a casting method, or the like may be used.

The molded product that includes the optical device may be cured by heating the molded product, or adding a curing agent to the optical device sealing material, and curing the molded product utilizing the curing agent, for example. These methods may be used in combination. In the present invention, it is preferable to cure the molded product by heating. Since the present invention utilizes the silane compound polymer obtained by condensing specific silane compounds, a cured product can be obtained in high yield by heating without using a curing agent.

When curing the molded product by heating, the heating temperature is appropriately determined depending on the type of optical device sealing material, and the like, but is normally 100 to 200° C. The heating time is normally 10 minutes to 20 hours, and preferably 30 minutes to 10 hours.

Figure 1:
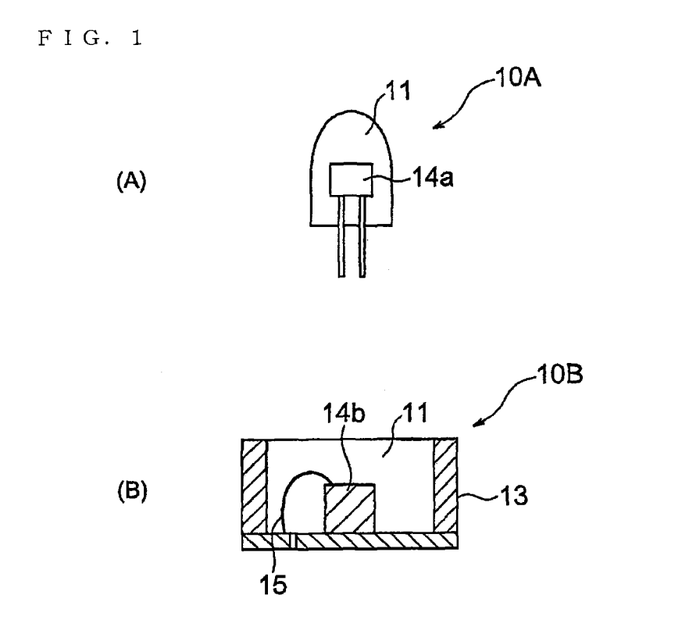
FIG. 1 is a view showing an example of a sealed optical device according to the present invention.

FIG. 1 shows an example of the sealed optical device according to the present invention. FIG. 1(A) shows a lamp-shaped sealed LED (10A) wherein an optical device (LED chip) (14a) is sealed with a cured product (11) of the optical device sealing material according to the present invention that is molded into a lamp shape.

FIG. 1(B) shows a surface mount device (SMD)-type sealed LED (10B) wherein a cured product (11) of the optical device sealing material according to the present invention is provided in a rectangular parallelepiped case (13) that has an upper opening and contains an LED chip (14b) that is mounted at the bottom thereof. In FIG. 1(B), reference numeral 15 indicates a wire connected to the LED chip.

The sealed optical device shown in FIG. 1 may be produced as follows.

Figure 2:
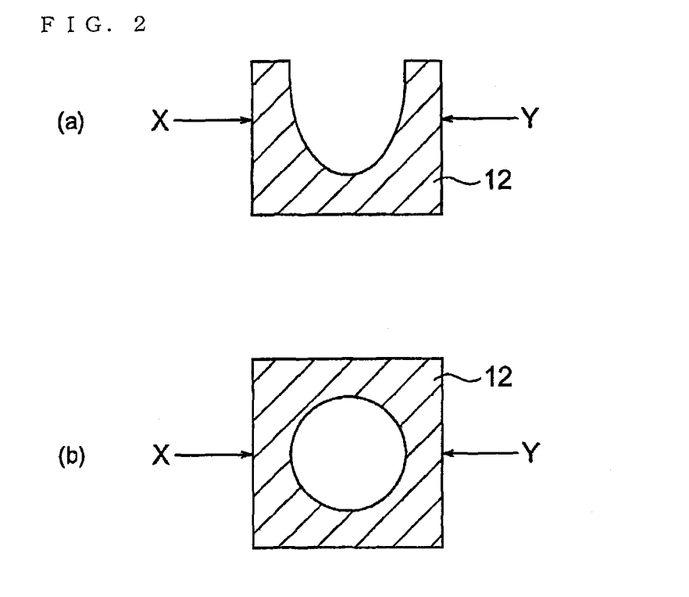
FIG. 2 is a schematic view showing a mold used for producing a lamp-shaped sealed LED.

The lamp-shaped sealed LED (10A) may be produced using a mold (12) that has a lamp-shaped recess (see FIGS. 2(a) and 2(b)). FIG. 2(a) is a cross-sectional view showing the mold (12) along the X-Y direction, and FIG. 2(b) is a top view showing the mold (12).

Figure 3:
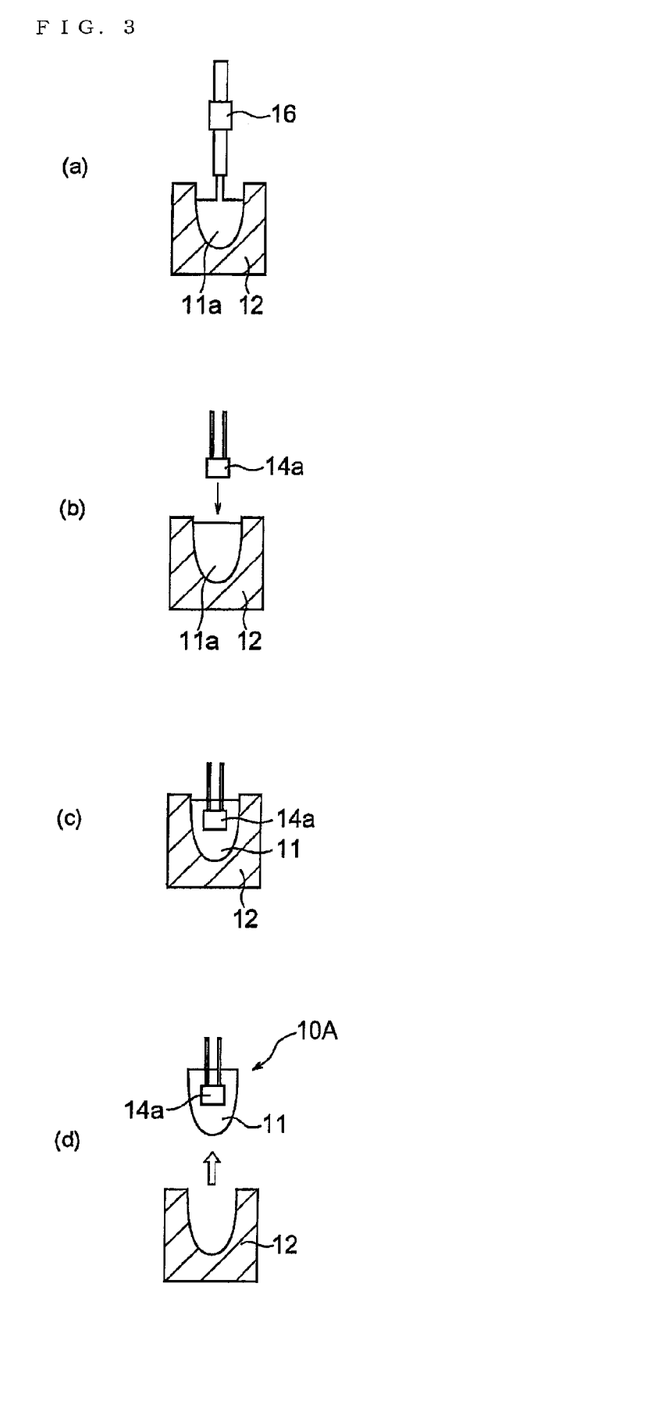
FIG. 3 is a cross-sectional view showing a production process of a lamp-shaped sealed LED.

As shown in FIG. 3(a), an optical device sealing material (11a) is injected into the mold (12) using an optical device sealing material injector (16). FIG. 3(a) shows only a nozzle of the optical device sealing material injector (16) for convenience.

As shown in FIG. 3(b), an LED chip (14a) is placed at an appropriate position. As shown in FIG. 3(c), the entire sealing material is heated to a given temperature to cure the optical device sealing material. As shown in FIG. 3(d), the cured product is removed from the mold (12) to obtain a lamp-shaped sealed LED (10A).

Figure 4:
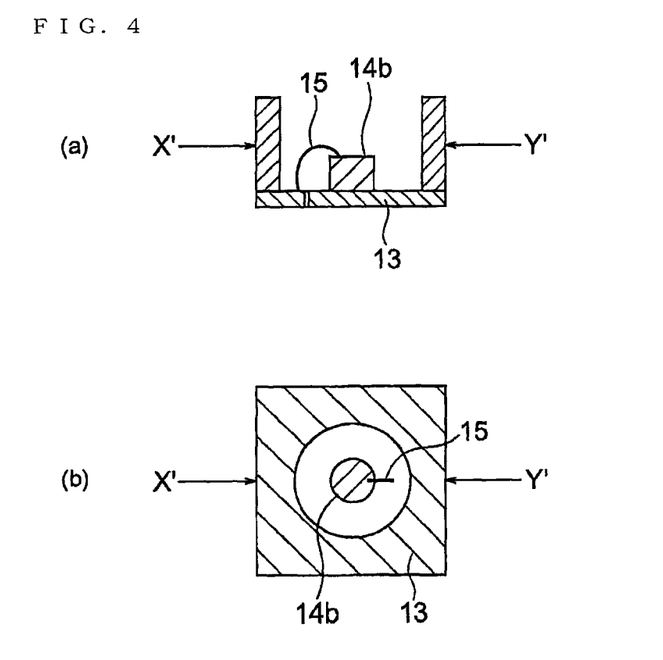
FIG. 4 is a schematic view showing a rectangular parallelepiped case used for producing an SMD-type sealed LED.

An SMD-type sealed LED (10B) may be produced using a rectangular parallelepiped case (13) that has an upper opening and contains an LED chip (14b) that is mounted at the bottom thereof (see FIGS. 4(a) and 4(b)). FIG. 4(a) is a cross-sectional view showing the rectangular parallelepiped case (13) along the X'-Y' direction, and FIG. 4(b) is a top view showing the rectangular parallelepiped case (13).

Figure 5:
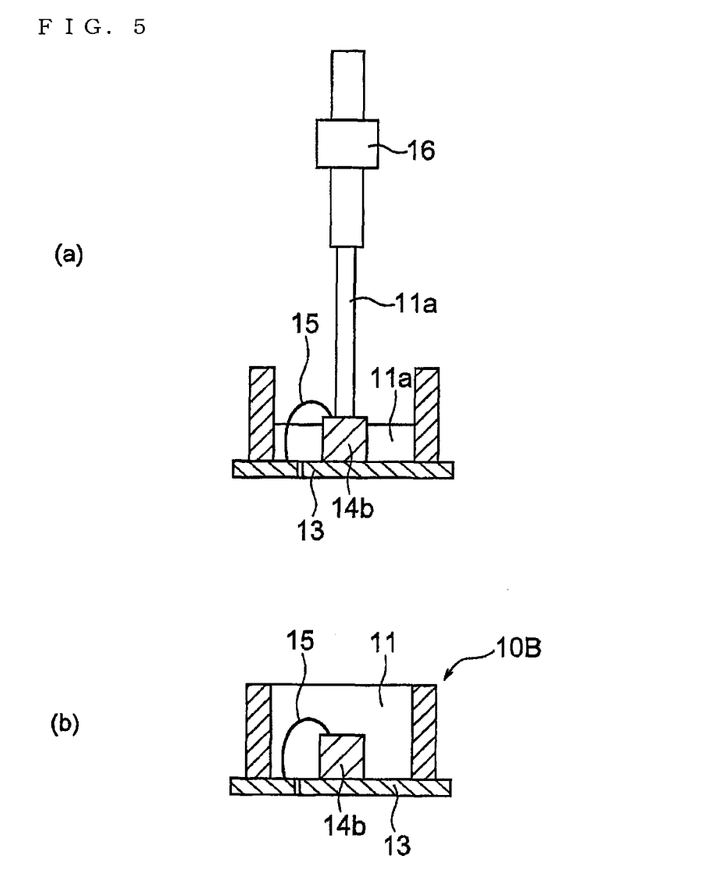
FIG. 5 is a cross-sectional view showing a production process of an SMD-type sealed LED.

As shown in FIG. 5(a), the optical device sealing material (11a) is injected into the rectangular parallelepiped case (13) using the optical device sealing material injector (16). FIG. 5(a) shows only a nozzle of the optical device sealing material injector (16) for convenience.

The entire optical device sealing material (11a) is heated to a given temperature to cure the optical device sealing material (11a). An SMD-type sealed LED (10B) shown in FIG. 5(b) is thus obtained.

Since the sealed optical device according to the present invention utilizes the optical device sealing material according to the present invention, the sealed optical device does not show coloration due to heat and light, exhibits excellent heat resistance, even when using an optical device (e.g., white or blue LED) that has a short emission peak wavelength of 350 to 490 nm.

EXAMPLES

The present invention is further described below by way of examples and comparative examples. Note that the present invention is not limited to the following examples.

(Measurement of Weight Average Molecular Weight)

The weight average molecular weight (Mw) was determined as a standard polystyrene-reduced value by gel permeation chromatography (GPC) using tetrahydrofuran (THF) as a solvent. The measurement was carried out using a GPC measurement device ("HLC-8220 GPC" manufactured by Tosoh Corporation) under the following conditions.
Column: TSKgel GMHXL→TSKgel GMHXL→TSKgel 2000HXL
Solvent: THF
Measurement temperature: 40° C.
Flow rate: 1 ml/min
Detector: differential refractometer The following silane compounds were used in Examples 1 to 14 and Comparative Example 1.
(1) Silane Compound (1)
1A: 3-acetoxypropyltrimethoxysilane (manufactured by AZmax Co., Ltd.)
1B: 2-cyanoethyltrimethoxysilane (manufactured by AZmax Co., Ltd.)
1C: 3-cyanopropyltriethoxysilane (manufactured by AZmax Co., Ltd.)
(2) Silane Compound (2)
2A: tetramethoxysilane (manufactured by Tokyo Kasei Kogyo Co., Ltd.)
2B: tetraethoxysilane (manufactured by Tokyo Kasei Kogyo Co., Ltd.)

2C: tetra-n-propoxysilane (manufactured by Tokyo Kasei Kogyo Co., Ltd.)

(3) Silane Compound (3)

3A: phenyltrimethoxysilane (manufactured by Tokyo Kasei Kogyo Co., Ltd.)

(4) Silane Compound (4)

4A: 3-glycidoxypropyltrimethoxysilane (manufactured by Tokyo Kasei Kogyo Co., Ltd.)

Examples 1 to 14 and Comparative Example 1

A 200 ml recovery flask equipped with a stirring rod was charged with 20 ml of toluene and 10 ml of distilled water (as a solvent). Silane compounds (1), (2), (3), and (4) shown in Table 1 were added to the mixture in a ratio shown in Table 1. After the addition of 0.10 g (1 mmol) of phosphoric acid (manufactured by Kanto Chemical Co., Inc.) (catalyst) with stirring, the mixture was stirred continuously at room temperature for 16 hours. After completion of the reaction, a saturated aqueous solution of sodium hydrogencarbonate was added to the reaction mixture. After the addition of 100 ml of ethyl acetate, the organic layer was isolated preparatively. The organic layer was then washed twice with distilled water, and dried over anhydrous magnesium sulfate, and magnesium sulfate was separated by filtration. The filtrate was added dropwise to a large quantity of n-hexane to effect precipitation. After separating n-hexane by decantation, the precipitate was dissolved in THF, and the solution was recovered. After evaporating THF under reduced pressure using an evaporator, the product was dried under vacuum to obtain a silane compound polymer (1 to 15). The silane compound polymer was solely used as a fixing material (1 to 15) without adding additives.

TABLE 1

| | Silane compound (1) Amount (mmol) | Silane compound (2) Amount (mmol) | Silane compound (3) Amount (mmol) | Silane compound (4) Amount (mmol) | Fixing material | Mw |
|---|---|---|---|---|---|---|
| Example 1 | 1A 20 | 2A 2 | 3A 20 | — | 1 | 2800 |
| Example 2 | 1A 20 | 2A 4 | 3A 20 | — | 2 | 2100 |
| Example 3 | 1A 20 | 2A 6 | 3A 20 | — | 3 | 2500 |
| Example 4 | 1A 20 | 2B 2 | 3A 20 | — | 4 | 2400 |
| Example 5 | 1A 20 | 2B 4 | 3A 20 | — | 5 | 2700 |
| Example 6 | 1A 20 | 2B 6 | 3A 20 | — | 6 | 2500 |
| Example 7 | 1A 20 | 2C 2 | 3A 20 | — | 7 | 2000 |
| Example 8 | 1A 20 | 2C 4 | 3A 20 | — | 8 | 1900 |
| Example 9 | 1A 20 | 2C 6 | 3A 20 | — | 9 | 2000 |
| Example 10 | 1A 32 | 2B 8 | — | — | 10 | 3000 |
| Example 11 | 1B 20 | 2B 4 | 3A 20 | — | 11 | 3200 |
| Example 12 | 1B 20 | 2B 8 | 3A 20 | — | 12 | 3800 |
| Example 13 | 1C 20 | 2B 4 | 3A 20 | — | 13 | 3500 |
| Example 14 | 1B 10 | 2B 4 | 3A 30 | — | 14 | 2800 |
| Comparative Example 1 | — | — | 3A 20 | 4A 20 | 15 | 2100 |

(Measurement of Initial Transmittance)

Each of the fixing materials 1 to 15 obtained in Examples 1 to 14 and Comparative Example 1 was poured into a mold to a length of 25 mm, a width of 20 mm, and a thickness of 1 mm, and cured by heating at 170° C. for two hours to prepare a specimen. The initial transmittance (%) (wavelength: 400 nm) of the specimen was measured using a spectrophotometer ("MPC-3100" manufactured by Shimadzu Corporation).

(Measurement of Transmittance after Heating)

After measuring the initial transmittance, the specimen was allowed to stand in an oven at 150° C. for 100 hours or 500 hours. The transmittance (%) (wavelength: 400 nm) of the specimen was then measured. The transparency thus measured was taken as the transmittance after heating.

(Measurement of Hardness)

Each of the fixing materials 1 to 15 obtained in Examples 1 to 14 and Comparative Example 1 was poured into a mold to a length of 25 mm, a width of 25 mm, and a thickness of 2 mm, and cured by heating at 170° C. for two hours to prepare a specimen (three specimens were prepared from each fixing material). The three specimens prepared from each fixing material were stacked, and the hardness (Shore D) of the stacked specimens was measured using a type D durometer ("DD2-D" manufactured by Kobunshi Keiki Co., Ltd.) in accordance with HS K 7215. The hardness was measured 10 times, and the average value of the measured values was taken as the hardness (Shore D). The results are shown in Table 2.

TABLE 2

| | Fixing material | Initial transmittance (%) | Transmittance after heating (%) After 100 hours | Transmittance after heating (%) After 500 hours | Shore D |
|---|---|---|---|---|---|
| Example 1 | 1 | 90.8 | 89.2 | 88.3 | 29 |
| Example 2 | 2 | 91.0 | 89.6 | 88.8 | 41 |
| Example 3 | 3 | 91.3 | 89.8 | 90.0 | 55 |
| Example 4 | 4 | 89.3 | 88.6 | 88.0 | 42 |
| Example 5 | 5 | 89.9 | 89.1 | 88.3 | 48 |
| Example 6 | 6 | 90.0 | 89.1 | 88.2 | 49 |
| Example 7 | 7 | 89.2 | 88.4 | 87.2 | 20 |
| Example 8 | 8 | 89.2 | 88.5 | 87.8 | 29 |
| Example 9 | 9 | 90.1 | 88.4 | 87.9 | 43 |
| Example 10 | 10 | 89.7 | 88.9 | 88.5 | 42 |
| Example 11 | 11 | 90.3 | 88.4 | 87.1 | 45 |
| Example 12 | 12 | 89.8 | 89.1 | 88.4 | 52 |
| Example 13 | 13 | 88.3 | 87.6 | 86.8 | 38 |
| Example 14 | 14 | 91.7 | 90.3 | 89.6 | 49 |
| Comparative Example 1 | 15 | 88.3 | 58.5 | 35.3 | 39 |

As shown in Table 2, the fixing materials 1 to 14 of Examples 1 to 14 exhibited excellent transparency and heat resistance over a long time as compared with the fixing material 15 of Comparative Example 1.

(Adhesion Test)

A silicone rubber sheet (thickness: 1 mm) having a hole (diameter: 3 mm) formed therein was secured on an adherend (gold (gold-plated copper sheet), silver (silver-plated copper sheet), or SS304). Each of the fixing materials 1 to 15 obtained in Examples 1 to 14 and Comparative Example 1 was poured into the hole, and cured by heating at 140° C. for six hours. The silicone rubber sheet was then removed, and the adhesive strength between the adherend and the adhesive was measured using a bond tester (series 4000 manufactured by Dage Co., Ltd.). The results are shown in Table 3.

TABLE 3

| | Fixing material | Adhesive strength (N/ø3 mm) | | |
| --- | --- | --- | --- | --- |
| | | Gold | Silver | SS304 |
| Example 1 | 1 | 42 | 43 | 43 |
| Example 2 | 2 | 44 | 42 | 45 |
| Example 3 | 3 | 46 | 46 | 47 |
| Example 4 | 4 | 43 | 42 | 40 |
| Example 5 | 5 | 41 | 42 | 42 |
| Example 6 | 6 | 45 | 43 | 45 |
| Example 7 | 7 | 40 | 41 | 41 |
| Example 8 | 8 | 39 | 42 | 43 |
| Example 9 | 9 | 43 | 42 | 42 |
| Example 10 | 10 | 41 | 41 | 45 |
| Example 11 | 11 | 40 | 41 | 40 |
| Example 12 | 12 | 45 | 43 | 44 |
| Example 13 | 13 | 37 | 37 | 39 |
| Example 14 | 14 | 52 | 51 | 53 |
| Comparative Example 1 | 15 | 18 | 16 | 23 |

As shown in Table 3, the fixing materials 1 to 14 of Examples 1 to 14 exhibited excellent adhesion to various adherends as compared with the fixing material 15 of Comparative Example 1.

EXPLANATION OF LETTERS OR NUMERALS

10A: lamp-shaped sealed LED, 10B: SMD-type sealed LED, 11: cured product of optical device sealing material, 11a: optical device sealing material, 12: mold, 13: rectangular parallelepiped case, 14a, 14b: LED chip, 15: wire, 16: optical device sealing material injector (nozzle)

The invention claimed is:

1. A method of manufacturing a sealed optical device, comprising:
    applying a fixing material to an optical device, said fixing material including a silane compound polymer as a main component, said silane compound polymer being produced by condensing a silane compound mixture that includes:
        at least one silane compound (1) shown by the following formula (1):

$R^1Si(OR^2)_p(X^1)_{3-p}$, (1)

at least one silane compound (2) shown by the following formula (2):

$Si(OR^3)_q(X^2)_{4-q}$, (2), at least one silane compound (3) shown by the following formula (3):

$R^4Si(OR^5)_r(X^3)_{3-r}$. (3), wherein $R^1$ represents a group including an ester structure or a cyanoalkyl group,
    wherein $R^2$ represents an alkyl group having 1 to 6 carbon atoms, an alkoxyalkyl group having 2 to 10 carbon atoms, or a group shown by $Si(R^a)(R^b)(R^c)$,
    wherein $R^a$, $R^b$, and $R^c$ individually represent a hydrogen atom, an alkyl group having 1 to 6 carbon atoms, an aryl group, or a halogen atom,
    wherein at least one of $R^a$, $R^b$ and $R^c$ represents a halogen atom when p is 3 and all of $R^2$ represent the group shown by $Si(R^a)(R^b)(R^c)$,
    wherein $X^1$ represents a halogen atom,
    wherein p is an integer from 0 to 3,
    wherein $R^3$ represents an alkyl group having 1 to 6 carbon atoms,
    wherein $X^2$ represents a halogen atom,
    wherein q is an integer from 0 to 4,
    wherein $R^4$ represents (a) a phenyl group optionally including a substituent, excluding a phenyl group that includes an ester structure, (b) an alkyl group having 1 to 20 carbon atoms optionally including a substituent, excluding an alkyl group that includes an ester structure and a cyano group, or (c) an alkenyl group having 2 to 20 carbon atoms,
    wherein $R^5$ represents an alkyl group having 1 to 6 carbon atoms,
    wherein $X^3$ represents a halogen atom,
    wherein r is an integer from 0 to 3,
    wherein the molar ratio of the silane compound (1) to the silane compound (2) included in the silane compound mixture is 70:30 to 95:5, and
    wherein the silane compound polymer has a weight average molecular weight of 1000 to 10,000.

2. The method according to claim 1, wherein the optical device is selected from the group consisting of a light-emitting device, a light-receiving device, a hybrid optical device and an optical integrated circuit.

3. A sealed optical device, comprising an optical device produced by the method according to claim 1.

4. The sealed optical device according to claim 3, wherein the optical device is selected from the group consisting of a light-emitting device, a light-receiving device, a hybrid optical device and an optical integrated circuit.

5. The method according to claim 1, wherein the fixing material does not include a curing agent.

6. A method of bonding first and second target materials, comprising:
    applying a fixing material as an adhesive to at least one of the first and second target materials, and,
    contacting the first and second target materials,
    wherein said fixing material includes a silane compound polymer as a main component, said silane compound polymer being produced by condensing a silane compound mixture that includes:
        at least one silane compound (1) shown by the following formula (1):

$R^1Si(OR^2)_p(X^1)_{3-p}$, (1), at least one silane compound (2) shown by the following formula (2):

$Si(OR^3)_q(X^2)_{4-q}$, (2), at least one silane compound (3) shown by the following formula (3):

$R^4Si(OR^5)_r(X^3)_{3-r}$, (3), wherein $R^1$ represents a group including an ester structure or a cyanoalkyl group,
    wherein $R^2$ represents an alkyl group having 1 to 6 carbon atoms, an alkoxyalkyl group having 2 to 10 carbon atoms, or a group shown by $Si(R^a)(R^b)(R^c)$,
    wherein $R^a$, $R^b$, and $R^c$ individually represent a hydrogen atom, an alkyl group having 1 to 6 carbon atoms, an aryl group, or a halogen atom,
    wherein at least one of $R^a$, $R^b$, and $R^c$ represents a halogen atom when p is 3 and all of $R^2$ represent the group shown by $Si(R^a)(R^b)(R^c)$,
    wherein $X^1$ represents a halogen atom,
    wherein p is an integer from 0 to 3,
    wherein $R^3$ represents an alkyl group having 1 to 6 carbon atoms,
    wherein $X^2$ represents a halogen atom,
    wherein q is an integer from 0 to 4, wherein R⁴ represents (a) a phenyl group optionally including a substituent, excluding a phenyl group that includes an ester structure, (b) an alkyl group having 1 to 20 carbon atoms optionally including a substituent, excluding an alkyl group that includes an ester structure and a cyano group, or (c) an alkenyl group having 2 to 20 carbon atoms, wherein R⁵ represents an alkyl group having 1 to 6 carbon atoms, wherein X³ represents a halogen atom, wherein r is an integer from 0 to 3, wherein the molar ratio of the silane compound (1) to the silane compound (2) included in the silane compound mixture is 70:30 to 95:5, and wherein the silane compound polymer has a weight average molecular weight of 1000 to 10,000.

7. The method according to claim 6, wherein the first and second target materials are selected from the group consisting of (i) glass and glass, (ii) ceramic and ceramic, (iii) metal and metal, (iv) synthetic resin and synthetic resin, (v) glass and ceramic, (vi) glass and metal, (vii) glass and synthetic resin, (viii) ceramic and metal, (ix) ceramic and synthetic resin and (x) metal and synthetic resin.

8. The method according to claim 6, wherein the fixing material does not include a curing agent.

9. A fixing material, comprising:

a silane compound polymer as a main component of the fixing material, the silane compound polymer being produced by condensing a silane compound mixture that includes:

at least one silane compound (1) shown by the following formula (1):

$$R^1Si(OR^2)_p(X^1)_{3-p} \qquad (1),$$

at least one silane compound (2) shown by the following formula (2):

$$Si(OR^3)_q(X^2)_{4-q}, \qquad (2),$$

at least one silane compound (3) shown by the following formula (3):

$$R^4Si(OR^5)_r(X^3)_{3-r}, \qquad (3),$$

wherein R¹ represents a group including an ester structure or a cyanoalkyl group, wherein R² represents an alkyl group having 1 to 6 carbon atoms, an alkoxyalkyl group having 2 to 10 carbon atoms, or a group shown by Si(Rᵃ)(Rᵇ)(Rᶜ), wherein Rᵃ, Rᵇ, and Rᶜ individually represent a hydrogen atom, an alkyl group having 1 to 6 carbon atoms, an aryl group, or a halogen atom, wherein at least one of Rᵃ, Rᵇ, and Rᶜ represents a halogen atom when p is 3 and all of R² represent the group shown by Si(Rᵃ)(Rᵇ)(Rᶜ), wherein X¹ represents a halogen atom, wherein p is an integer from 0 to 3, wherein R³ represents an alkyl group having 1 to 6 carbon atoms, wherein X² represents a halogen atom, wherein q is an integer from 0 to 4, wherein R⁴ represents (a) a phenyl group optionally including a substituent, excluding a phenyl group that includes an ester structure, (b) an alkyl group having 1 to 20 carbon atoms optionally including a substituent, excluding an alkyl group that includes an ester structure and a cyano group, or (c) an alkenyl group having 2 to 20 carbon atoms, wherein R⁵ represents an alkyl group having 1 to 6 carbon atoms, wherein X³ represents a halogen atom, wherein r is an integer from 0 to 3, wherein the molar ratio of the silane compound (1) to the silane compound (2) included in the silane compound mixture is 70:30 to 95:5, and wherein the silane compound polymer has a weight average molecular weight of 1000 to 10,000.

10. The fixing material of claim 9, wherein the fixing material does not include a curing agent.

11. A sealing material, comprising the fixing material of claim 9.

12. An optical sealing material, comprising the fixing material of claim 9.

13. An adhesive, comprising the fixing material of claim 9.

* * * * *